United States Patent [19]

Gupta

[11] Patent Number: 6,163,877
[45] Date of Patent: *Dec. 19, 2000

[54] METHOD AND APPARATUS FOR OPTIMIZING TRANSISTOR CELL LAYOUT WITH INTEGRATED TRANSISTOR FOLDING

[75] Inventor: Avaneendra Gupta, Ann Arbor, Mich.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/744,199

[22] Filed: Nov. 5, 1996

[51] Int. Cl.[7] .................................................. H01L 23/50
[52] U.S. Cl. ........................................................ 716/8
[58] Field of Search ................... 364/488, 489, 364/490, 491; 716/8

[56] References Cited

U.S. PATENT DOCUMENTS 5,675,501  10/1997  Aoki ........................................ 364/490
5,701,255  12/1997  Fukui ...................................... 364/491
5,737,236  4/1998  Maziasz et al. ........................ 364/490

OTHER PUBLICATIONS

A. Gupta, S. The, P. Hayes, "XPRESS: A Cell Layout Generator with Integrated Transistor Folding", The European Design & Test Conference 1996, pp. 393–400.

Primary Examiner—Paul R. Lintz
Assistant Examiner—Thuan Do
Attorney, Agent, or Firm—Blakely, Sokoloff, Taylor & Zafman LLP

[57] ABSTRACT

A computer implemented method for generating a layout for a set of transistors on a semiconductor chip. The method comprises the step of folding transistors of the set whose sizes exceed a predetermined maximum size. Then a list of implicitly enumerated diffusion sharing arrangements of the transistors of the set is created. The method also comprises the step of choosing an arrangement from the list that uses the least horizontal space on the chip and generating a layout of the set of transistors on the chip according to the chosen arrangement. Embodiments of the invention generate diffusion sharing arrangements that are unique with respect to transistor folds, transistor orientations, and transistor fold interlacing arrangements.

29 Claims, 14 Drawing Sheets

FIG_1

FIG_3

FIG_4

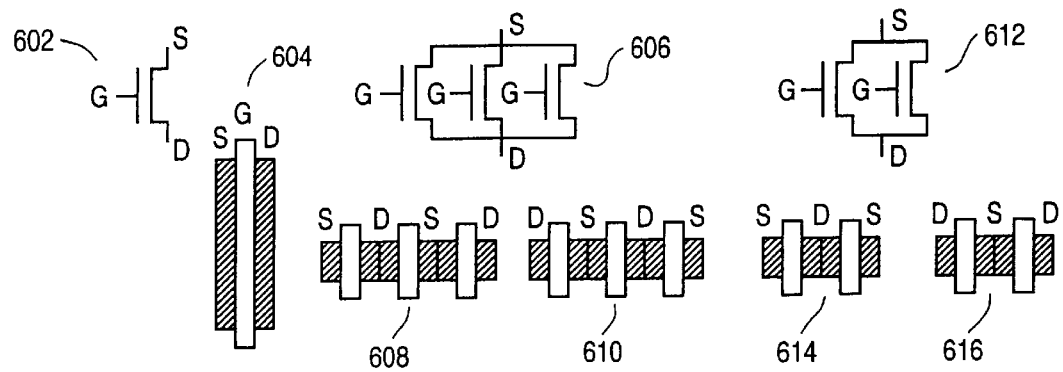
FIG_6
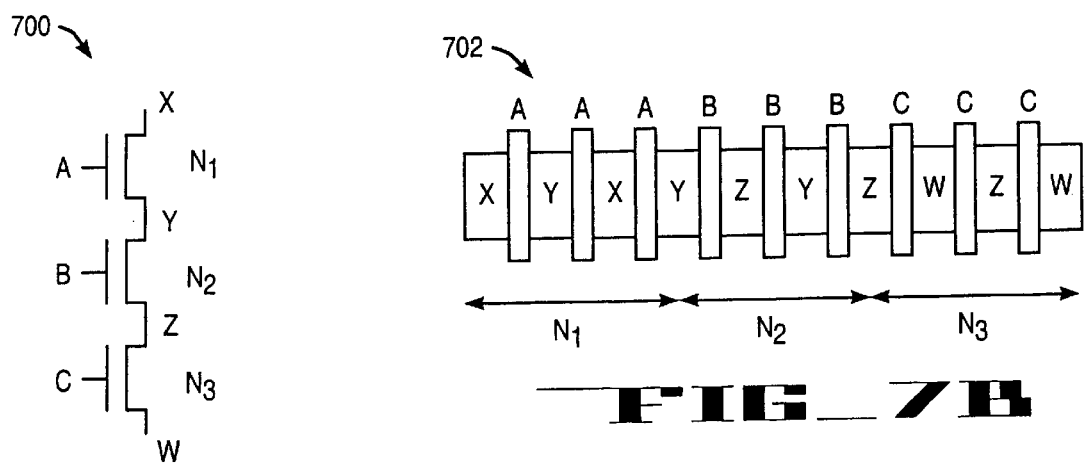
FIG_7B
FIG_7A

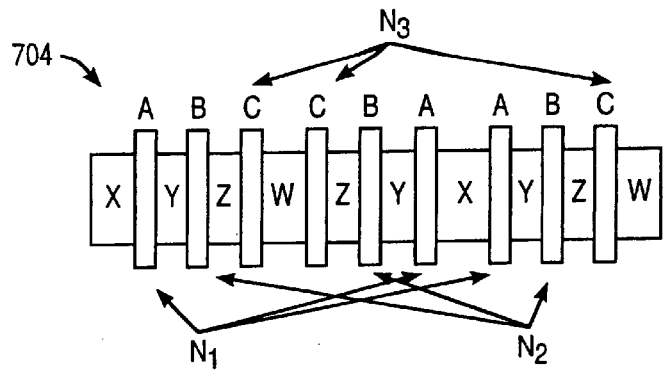
FIG_7C
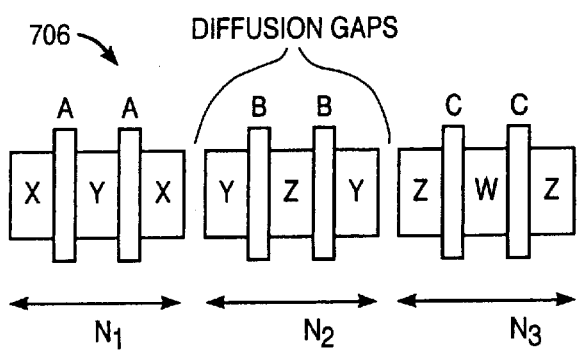
FIG_7D
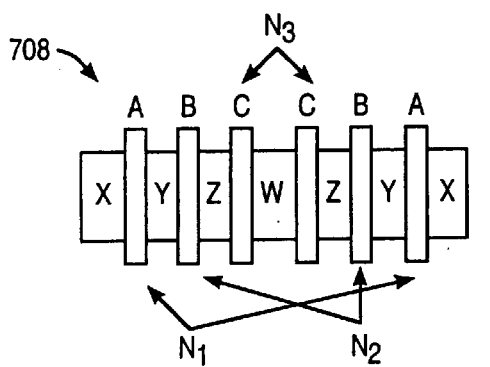
FIG_7E

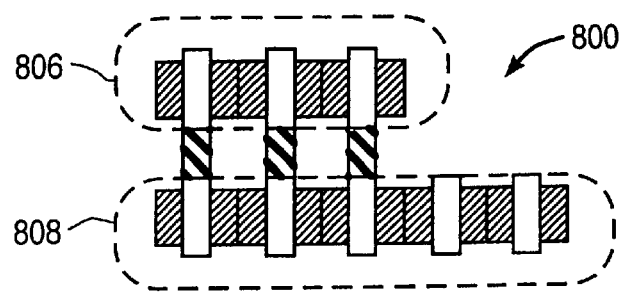
FIG_8A
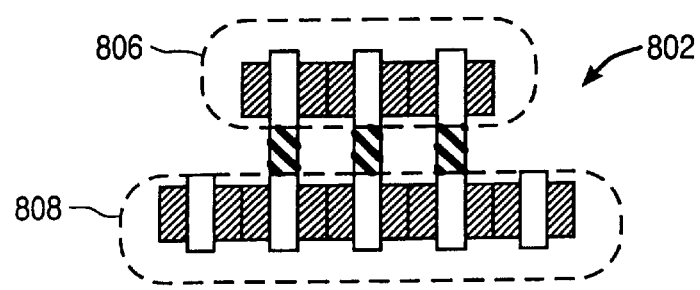
FIG_8B
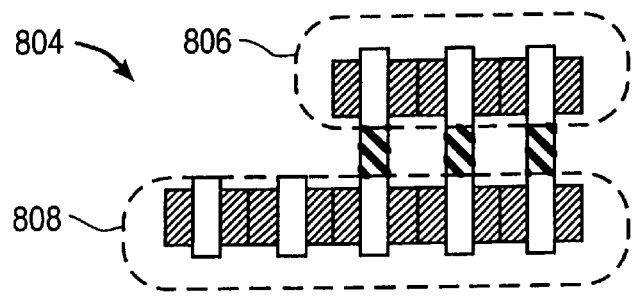
FIG_8C

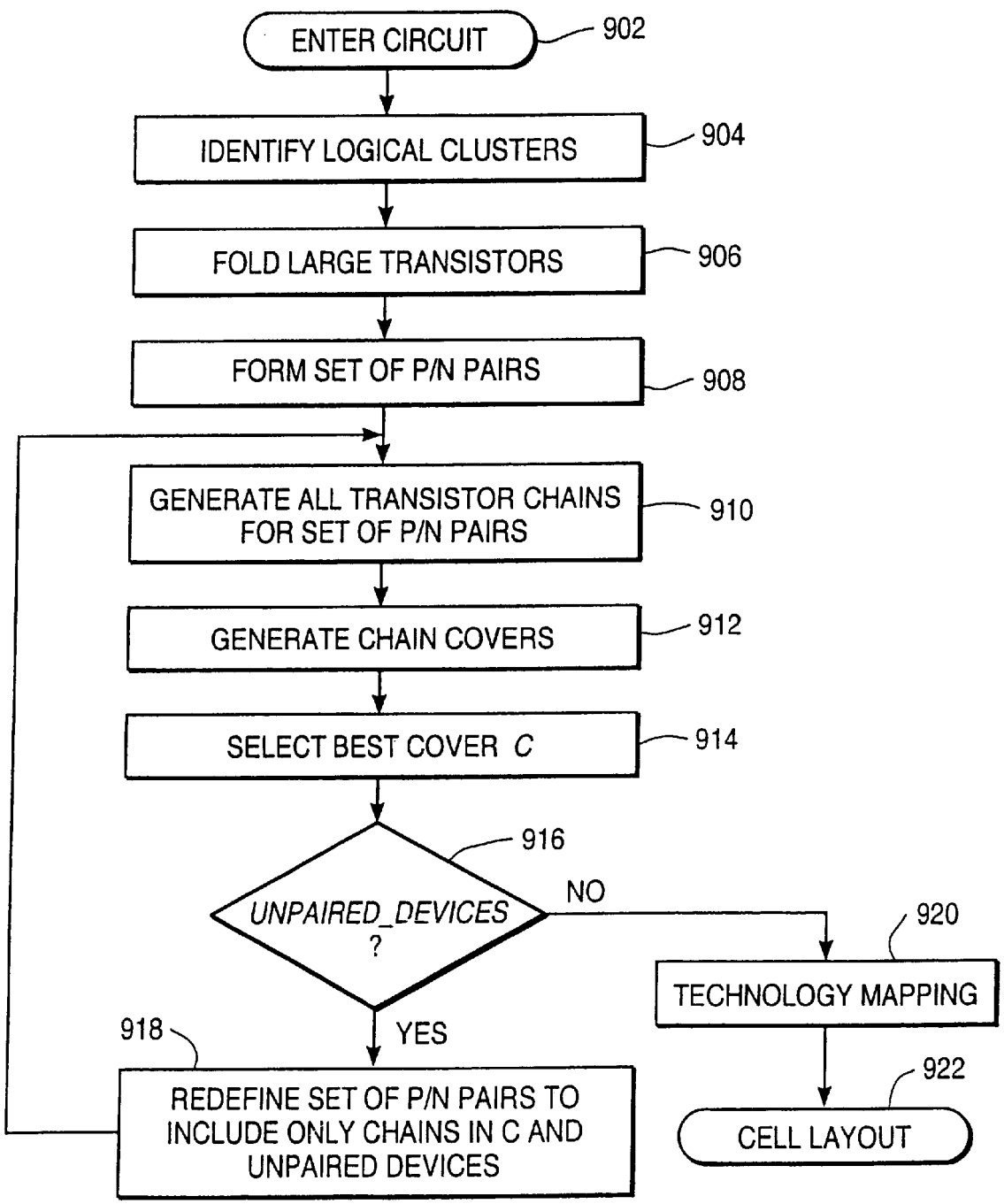
FIG_9

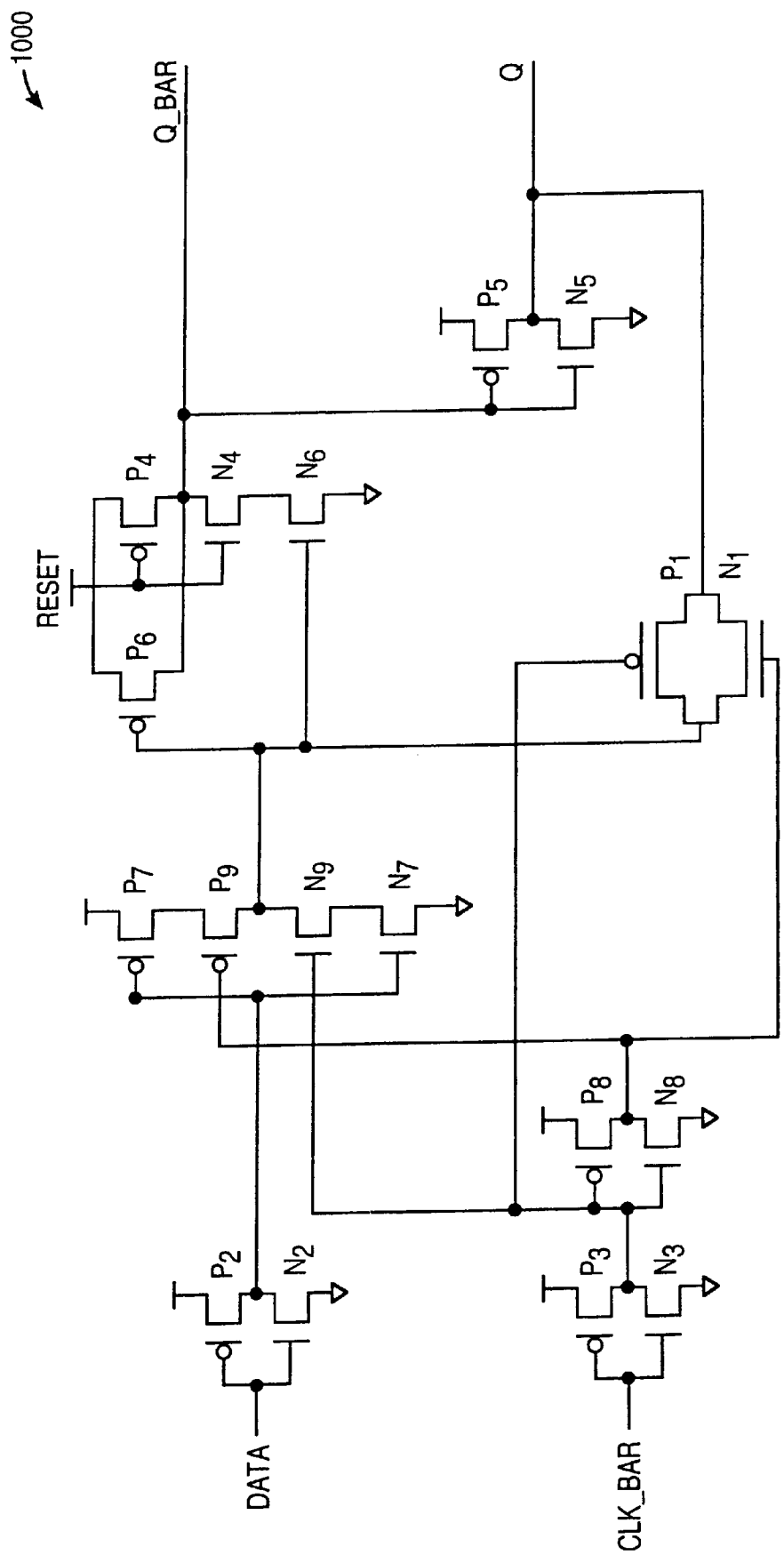
FIG._10A

| PAIR# | REASON FOR PAIRING |
|---|---|
| $PAIR_1$ ($P_1$, $N_1$) | TRANSMISSION GATE |
| $PAIR_2$ ($P_2$, $N_2$) | COMMON GATE NET |
| $PAIR_3$ ($P_3$, $N_3$) | |
| $PAIR_4$ ($P_4$, $N_4$) | |
| $PAIR_5$ ($P_5$, $N_5$) | |
| $PAIR_6$ ($P_6$, $N_6$) | |
| $PAIR_7$ ($P_7$, $N_7$) | |
| $PAIR_8$ ($P_8$, $N_8$) | |
| $PAIR_9$ ($P_9$, $N_9$) | COMMON DIFFUSION |

FIG_10B

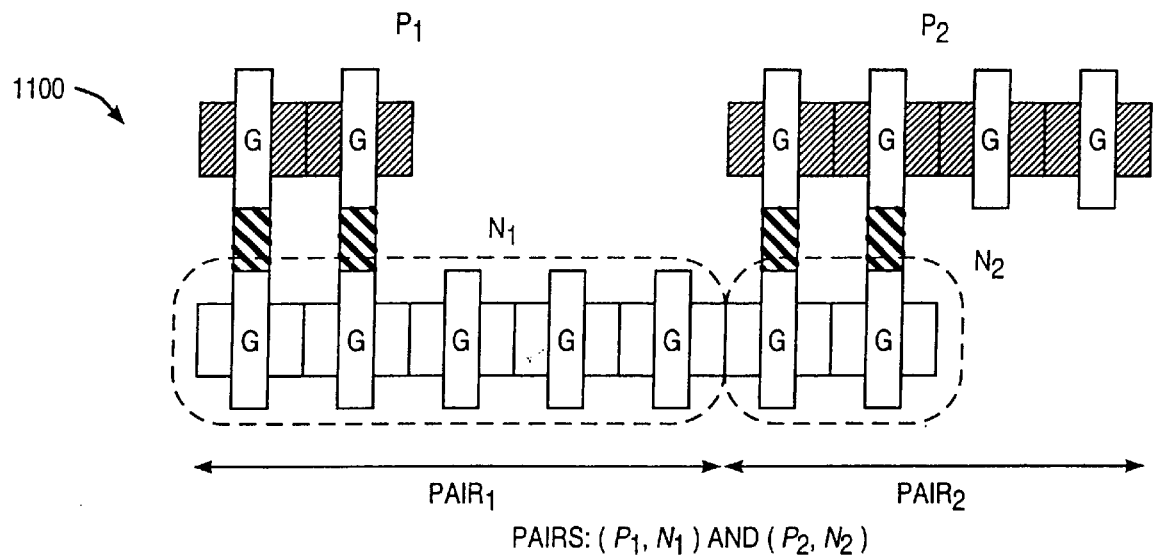
PAIRS: ($P_1$, $N_1$) AND ($P_2$, $N_2$)
FIG_11A
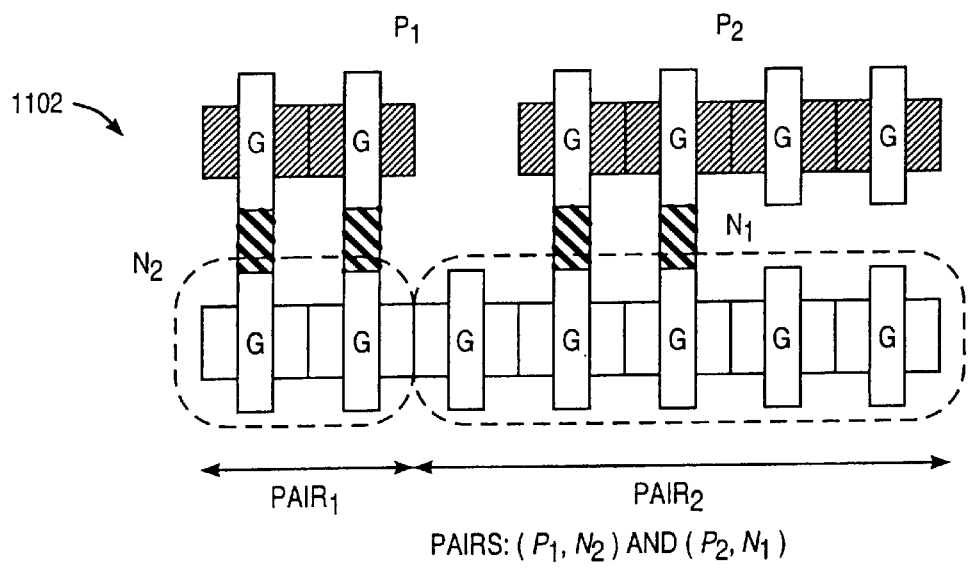
PAIRS: ($P_1$, $N_2$) AND ($P_2$, $N_1$)
FIG_11B

1202 —

PAIR$_1$: 5, 9
PAIR$_2$: 3, 5, 6, 7, 8
PAIR$_3$: 2, 5, 6, 7, 8
PAIR$_4$: 6, 6
PAIR$_5$: 1, 2, 3, 6, 7, 8
PAIR$_6$: 2, 3, 4, 4, 5, 7, 8
PAIR$_7$: 2, 3, 5, 6, 8, 9
PAIR$_8$: 2, 3, 5, 6, 7
PAIR$_9$ 1, 7

ADJACENCY LIST IN THE FORM
< PAIR: LIST OF PAIRS THAT CAN
SHARE DIFFUSION >

1204

| CHAIN LENGTH | NO. OF CHAINS |
|---|---|
| 1 | 09 |
| 2 | 19 |
| 3 | 17 |
| 4 | 11 |
| 5 | 06 |
| 6 | 07 |
| 7 | 03 |
|  | 72 (TOTAL) |

CLASSIFICATION OF CHAINS
BY LENGTH

FIG_12A

| CLIQUE # | CHAINS (ORDERED LIST OF PAIRS) || INTERCONNECT COST |
|---|---|---|---|
|  | CHAIN #1 | CHAIN #2 |  |
| 1 | (8, 6, 4) | (2, 7, 9, 1, 5, 3) | 40 |
| 2 | (2, 6, 4) | (3, 7, 9, 1, 5, 8) | 37 |
| 3 | (3, 6, 4) | (2, 7, 9, 1, 5, 8) | 29 |
| 4 | (8, 2) | (3, 7, 9, 1, 5, 6, 4) | 27 |
| 5 | (8, 3) | (2, 7, 9, 1, 5, 6, 4) | 20 |
| 6 | (3, 3) | (8, 7, 9, 1, 5, 6, 4) | 14 |

FIG_12B

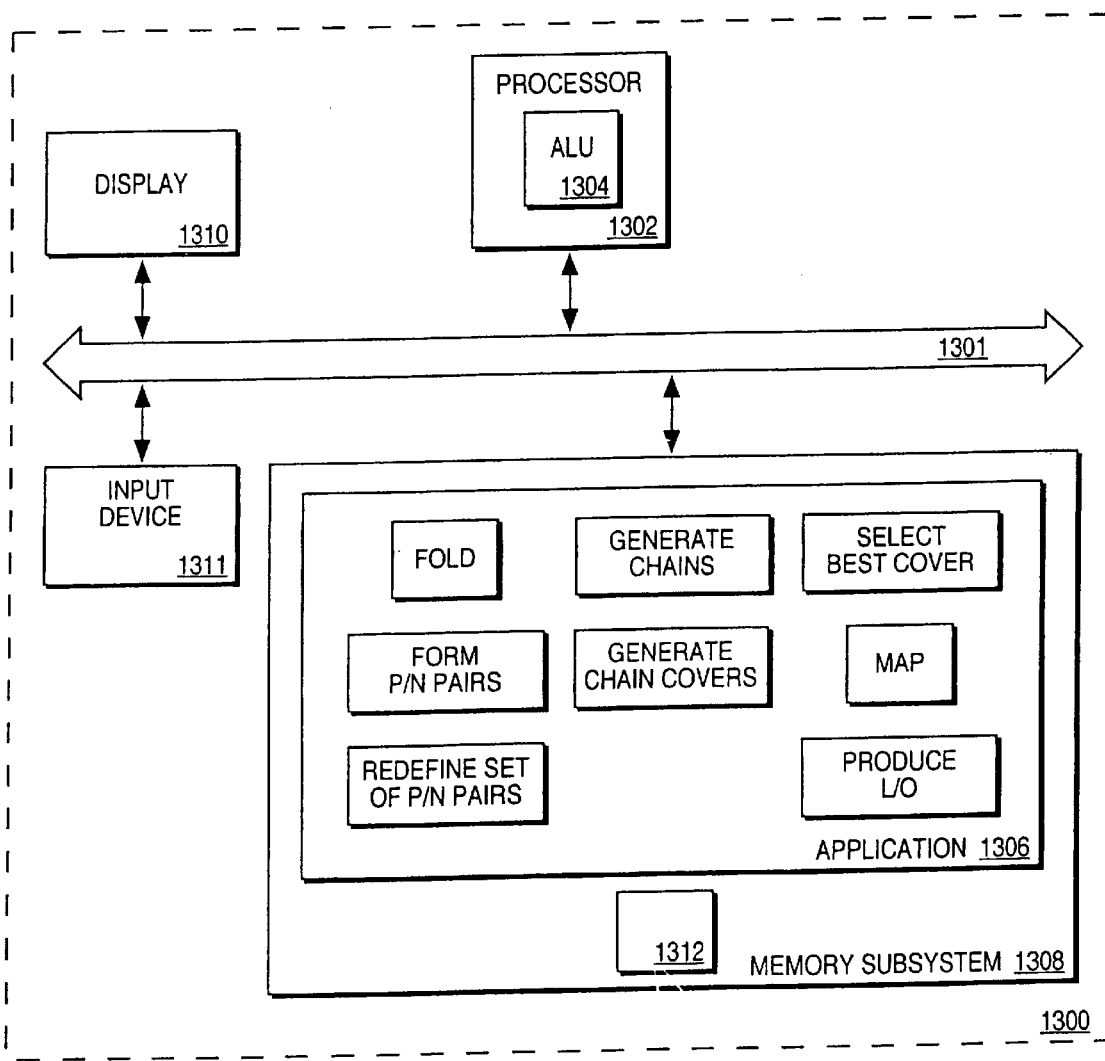
FIG_13

METHOD AND APPARATUS FOR OPTIMIZING TRANSISTOR CELL LAYOUT WITH INTEGRATED TRANSISTOR FOLDING

FIELD OF THE INVENTION

The present invention relates to the field of complimentary metal oxide semiconductor (CMOS) circuits, and more particularly to automatically producing layouts for CMOS circuits.

BACKGROUND OF THE INVENTION

Today's very large scale integrated circuits typically use CMOS technology. CMOS technology is advantageous in very large scale integrated circuit applications because of its relatively small power dissipation. CMOS devices include combinations of n-channel MOS (NMOS) and p-channel MOS (PMOS) transistors on adjacent regions of a semiconductor chip. FIG. 1 is a simplified illustration of a cross-section of a semiconductor chip 100. Regions of n-type material and p-type material are shown for p-channel device 102 and n-channel device 104. Regions of p-type or n-type material are also known as diffusion areas. Diffusion refers to the net motion of charge carriers from regions of high carrier concentration to regions of low carrier concentration. Diffusion represents the charge transport process in semiconductors.

As semiconductor chips become ever larger, incorporating ever more devices, it becomes increasingly important to minimize semiconductor area used by a given number of devices. Conservation of semiconductor area is a primary goal in semiconductor chip development because even a small added semiconductor area potentially translates into millions of dollars. Another goal of semiconductor development is to improve device performance. Device performance, simply stated, is the ability of the circuit to operate correctly with as great a speed as possible. The goal of saving semiconductor area and the goal of increasing device performance are usually interrelated. For instance, if devices are placed on a semiconductor chip closer together, the length charge must travel is reduced and greater speed is realized.

Various design factors complicate the task of designing a circuit for a semiconductor chip so as to minimize area usage. For example, transistor sizes vary in practical circuit designs, resulting in non-uniform transistor heights, which can lead to wasted semiconductor area.

Several techniques have been developed to address the problem of achieving optimal layout, where optimal layout refers to an arrangement of devices on a semiconductor chip so as to minimize area and maximize performance. One technique conserves area by placing transistors so as to share diffusion area. FIG. 2 illustrates this technique. Transistor layout 203 is a representation of a layout of a transistor whose schematic representation is 202. Similarly, transistor layout 205 represents a possible layout of a transistor represented by schematic 204. Because of the orientation of a drain diffusion area to the left of layout 205 and to the right of layout 203, the two transistors can be placed such that they share the drain diffusion area.

Another technique for conserving semiconductor area is known as transistor folding. Transistor folding is a process of converting a transistor into smaller, multiple transistors called folds, or legs, which are connected in parallel and must be placed together on a semiconductor chip. Transistors are folded in order to meet predetermined maximum height requirements. FIG. 3 shows a transistor before and after folding. Schematic 302 shows one transistor before folding. Schematic 306 is equivalent to schematic 302. Schematic 306 represents the transistor of schematic 302 after folding into two legs or folds. Layout 304 represents a layout of schematic 302. Layout 308 is one possible layout of schematic 306. Layout 310 is an alternate possible layout of schematic 306. Layout 308 is referred to as an unflipped orientation, and layout 310 is referred to as a flipped orientation.

The orientation of transistors after folding can have an effect on area usage. For example, note that two layouts 308 or two layouts 310 can be abutted so that a diffusion area is shared. However, a layout 308 and layout 310 cannot be abutted because the source and drain diffusion areas are not electrically equivalent.

Transistors which are abutted in a layout form transistor chains. It is desirable to produce a layout with a maximum number of transistors chained so as to minimize diffusion gaps.

Thus, a variety of available design techniques such as chaining of transistors, folding of transistors and flipping of folded transistors are available to the layout designer. This variety makes the transistor circuit layout process extremely complex. For this reason, design of transistor circuit layouts is a major contribution to design cycle time and cost.

Software tools currently exist which automatically generate layouts of a given circuit based upon cells, where a cell is an arrangement of transistors without multiple levels of hierarchy. Such tools are known as cell synthesis tools. Cell synthesis tools typically take a circuit description as input in the form of a net list or a schematic and output a graphical layout showing arrangement of transistors as an arrangement of diffusion areas on a semiconductor chip. Cell synthesis tools make layout design faster, but benefits of prior synthesis tools are limited by their inability to fully consider design constraints or to take full advantage of techniques which save semiconductor area and increase circuit performance.

One limitation of some prior art cell synthesis tools is that they make several impractical simplifying assumptions about the circuit. For example, they assume an equal number of p-type devices and n-type devices, uniform transistor size, and no transistor folding. Some prior art cell synthesis tools can perform transistor folding, but only perform simple transistor folding in a way that significantly decreases the effectiveness of the folding technique in producing improved layouts. Typically, prior art cell synthesis tools receive a circuit description and then map the circuit to a semiconductor chip. Mapping, also known as placing, is the process of specifying transistor locations on a physical device. After placement, simple folding is then performed without consideration of all possible orientations of transistors. Significantly, prior cell synthesis tools also fail to consider all possible combinations of transistors to produce chains. This results in a sub-optimal circuits with respect to area and performance. For example, because different orientations of transistors are not considered (flipped and unflipped), unnecessary diffusion gaps usually exist as explained previously with respect to FIG. 3.

For these reasons, graphical layouts produced using prior art cell synthesis tools usually require extensive manual rearrangement to improve performance and decrease area. This manual rearrangement adds to the overall cost of development and production. In addition, with manual optimization, there is no guarantee that device arrangements have been exhaustively sampled to produce an optimum achievable layout that meets all physical design rules.

As will be shown, the present invention provides an improved method and apparatus that more advantageously uses optimization techniques to produce a cell layout of minimum area that meets design constraints and physical design rules.

SUMMARY OF THE INVENTION

A computer implemented method for generating a layout for a set of transistors on a semiconductor chip is described. The method comprises the step of folding those transistors of the set whose sizes exceed a predetermined maximum size. Then a list of implicitly enumerated diffusion sharing arrangements of the transistors of the set is created. The method also comprises the steps of choosing an arrangement from the list that uses the least horizontal space on the chip and generating a layout of the set of transistors on the chip according to the chosen arrangement.

BRIEF DESCRIPTION OF THE DRAWINGS

FIG. 6 is an illustration of the effect of folding a transistor into an odd or an even number of folds on the terminals that appear at the ends of folded transistors;

FIG. 7a is a schematic diagram of a transistor circuit;

FIG. 7b is a layout of a schematic;

FIG. 7c is a layout of a schematic with fold interlacing;

FIG. 7d a layout of a schematic with no fold interlacing and diffusion gaps;

FIG. 7e a layout of a schematic with fold interlacing and no diffusion gaps;

FIG. 8a is a left justified transistor layout;

FIG. 8b is a centered transistor layout;

FIG. 8c is a right justified transistor layout;

FIG. 9 is a flow chart of an embodiment of the present invention;

FIG. 10a is a schematic diagram of a transistor circuit;

FIG. 10b is a table of P/N pairs;

FIG. 11a is a transistor layout of a particular P/N pairing;

FIG. 11b is a transistor layout of a particular P/N pairing;

FIG. 12a is a list of P/N pairs with their classification by length;

FIG. 12b is a table of cliques according to an embodiment of the present invention; and FIG. 13 is a simplified block diagram of a computer system implementing one embodiment of the present invention.

DETAILED DESCRIPTION

As will be shown, the present invention produces better layouts by considering transistor folding before placement. The present invention also takes fuller advantage of design techniques other than transistor folding during the formation of transistor chains. In addition, the present invention improves layouts with the novel technique of transistor fold interlacing, which will be described below.

In the following detailed description of the present invention, numerous specific details are set forth in order to provide a thorough understanding of the present invention. However, it will be apparent to one skilled in the art that the present invention may be practiced without these specific details. In other instances, well know methods, procedures, components, and circuits have not been described in detail to avoid obscuring the present invention.

Figure 4:
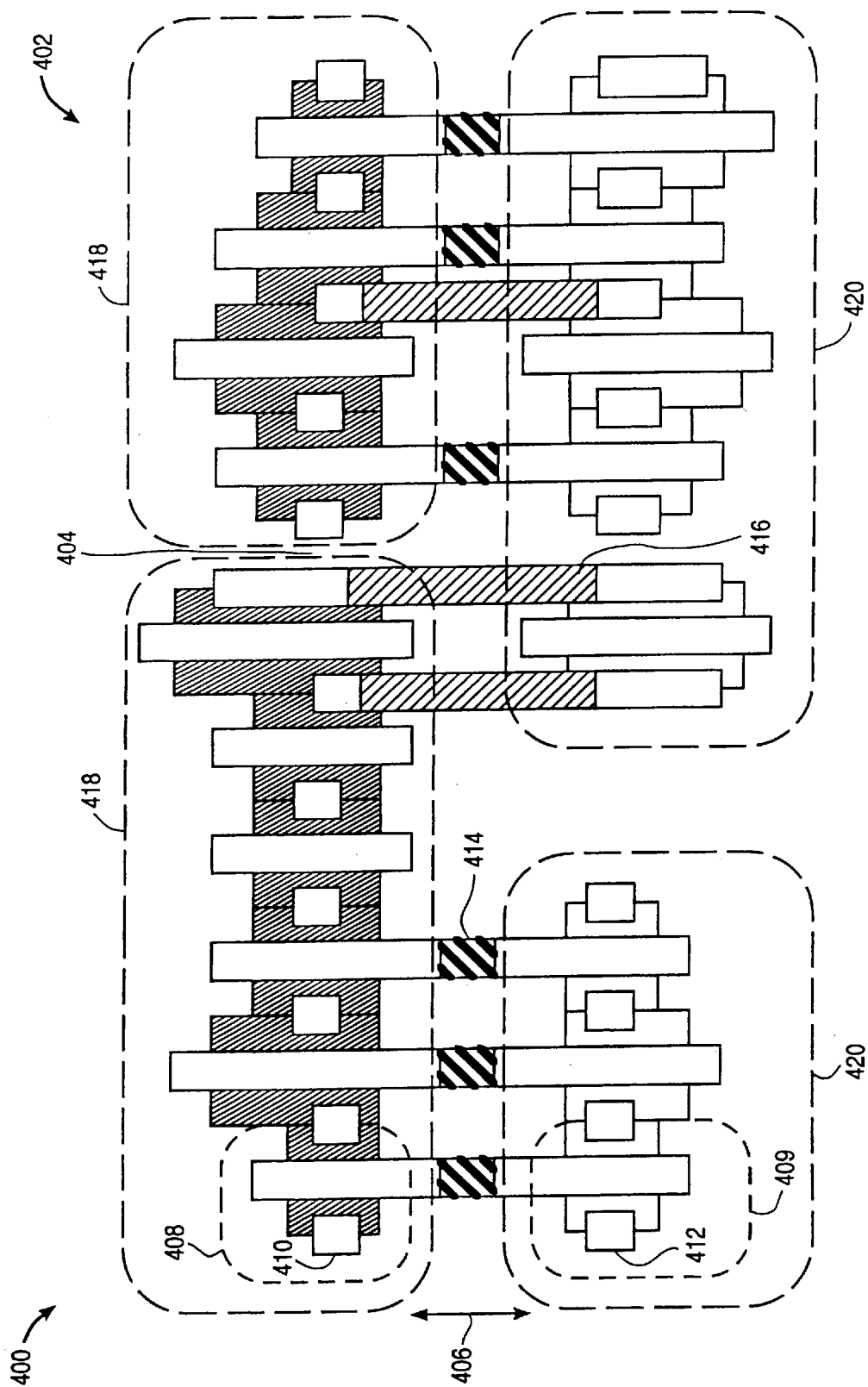
FIG. 4 is an illustration of transistor chains with a diffusion gap.

FIG. 4 is an illustration of a layout style known as one dimensional layout style. The present invention will be described as producing a layout of the one dimensional style, but other embodiments could be used to produce layouts of other styles. For example, other embodiments could produce layouts in gate matrix layout style. Gate matrix layout style is characterized by equally spaced vertical polysilicon columns that serve as transistor gates and general interconnects. Gate matrix layout style is also characterized by rows of diffusion and metal, with the intersection of horizontal diffusion and vertical polysilicon forming transistors.

Referring to FIG. 4, one dimensional layout 402 includes two horizontal diffusion rows for the placement of P and N transistors. PMOS transistors are placed in top row 418 and NMOS transistor are placed in bottom row 420. If two adjacent transistors have electrically equivalent terminals, they are abutted so as to share a diffusion area, forming a chain. Otherwise, they require a diffusion gap between them. NMOS and PMOS transistors are paired to form chains. FIG. 4 shows transistor chain 400 and transistor chain 402 with diffusion gap 404 between them.

Transistor 408 is typical of PMOS transistors in PMOS row 418. Transistor 409 is typical of an NMOS transistor in NMOS row 420. Transistors 408 and 409 form a P/N pair. P diffusion/metal contact 410 is part of PMOS transistor 408. N diffusion/metal contact 412 is part of NMOS transistor 409. P/N channel 406 is located between rows 418 and 420. Polysilicon area 414 is typical of polysilicon areas in P/N channel 406. First metal layer 416 is typical of a first metal layer connecting diffusion-metal contacts of members of a P/N pair.

Figure 1:
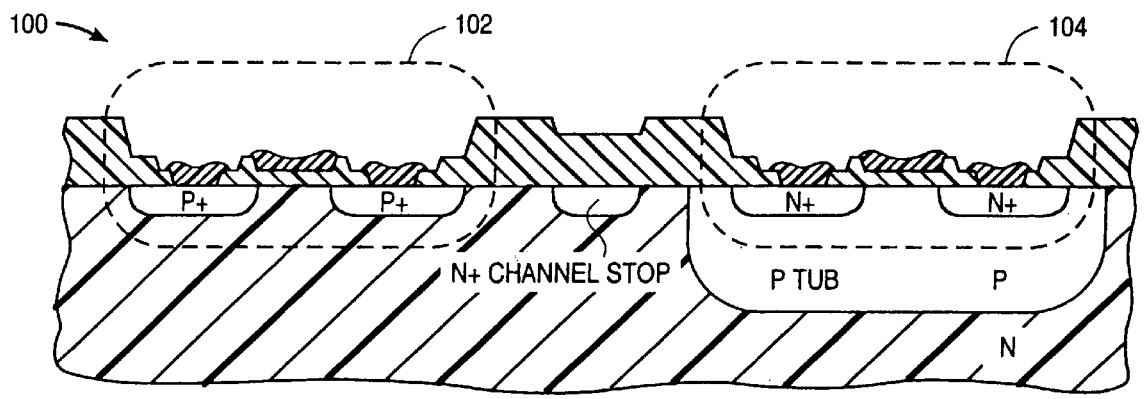
FIG. 1 is a simplified cross-sectional view of a semiconductor chip.
Figure 2:
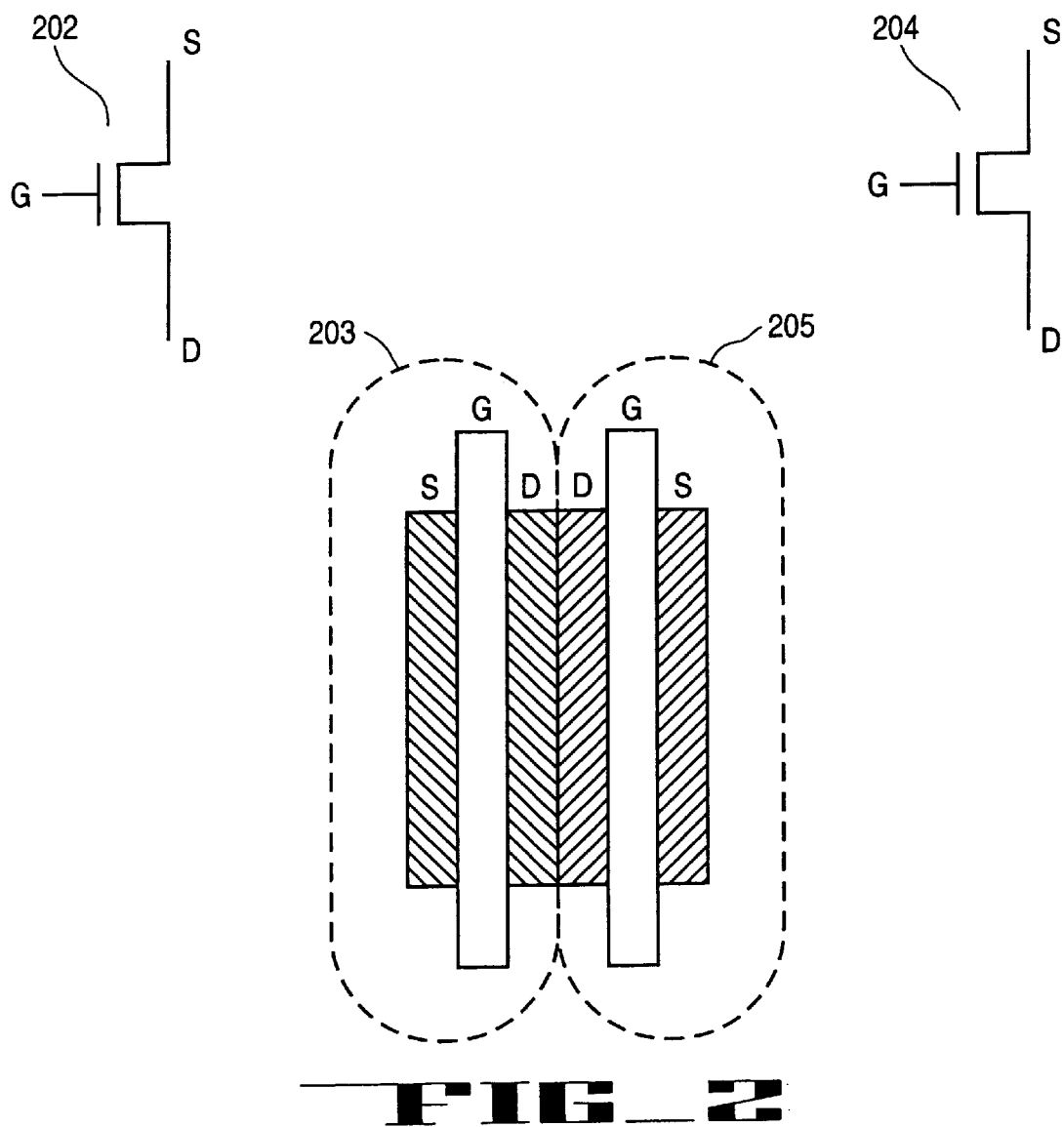
FIG. 2 is an illustration of diffusion sharing.
Figure 3:
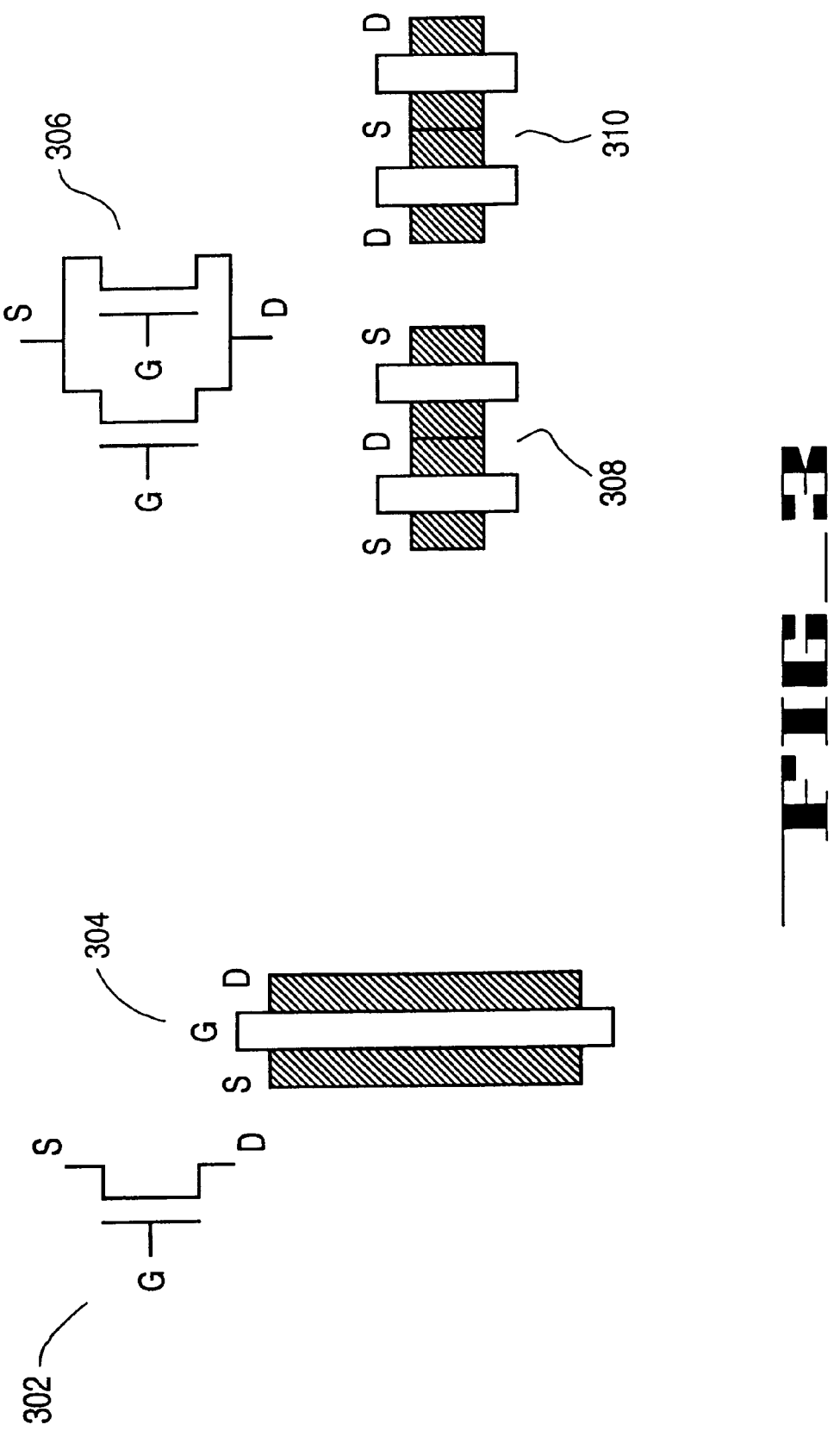
FIG. 3 is an illustration of a transistor before and after folding showing flipped and unflipped layouts.
Figure 5:
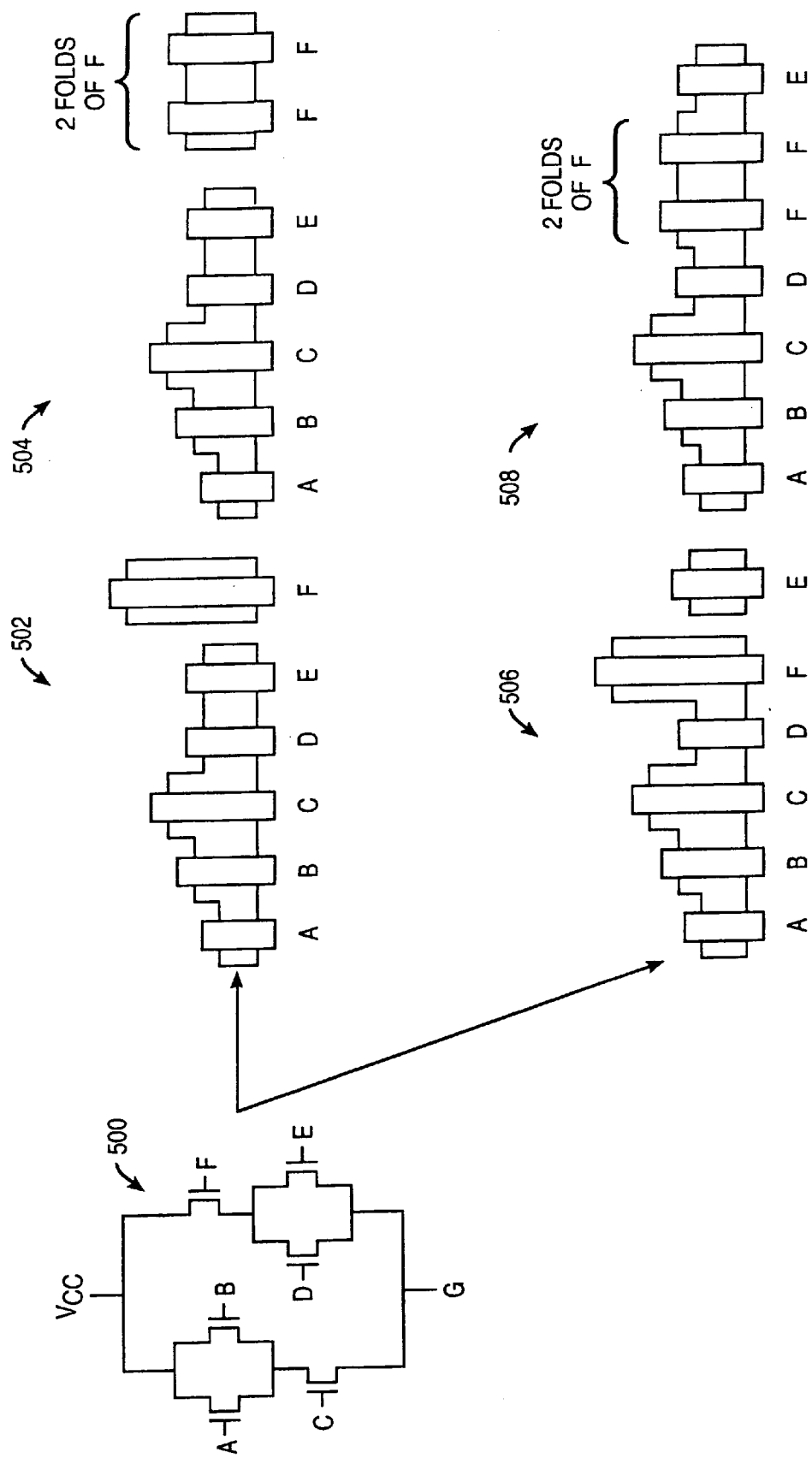
FIG. 5 is an illustration of the effect of folding on diffusion sharing.

FIG. 5 illustrates the effect of folding on diffusion sharing, as well as the advantage of folding before placement. Schematic 500 is an example of a transistor circuit. The circuit of schematic 500 includes a power terminal Vcc, and a ground terminal G. The circuit of schematic 500 includes transistors A, B, C, D, E and F. The transistors of schematic 500 can be arranged in a variety of chains. For example, layout 502 is a layout of the circuit using a chain A, B, C, D, E, and single transistor F. In FIG. 5, a representation of a transistor in a layout is shown as the outline of the transistor. For example, transistor F of layout 502 is an outline of a transistor without source, gate and drain explicitly labeled as in FIG. 3. Layout 502 illustrates that the transistors A through F are of variable sizes. Because of the electrical nature of the respective terminals, or nets on the left and right ends of chain ABCDE and of transistor F, transistor F cannot share diffusion in layout 502 with chain ABCDE, and therefore a gap exists between them. Layout 504 is produced by folding transistor F of layout 502 into two folds, as required by predetermined height requirements. A diffusion gap still exists between E and F in layout 504. Layout 504 is an example of folding performed after layout without consideration of relative positions of transistors in a chain.

Layout 506 is a layout of transistors A through F arranged in the order A, B, C, D, F, and single transistor E. A diffusion gap exists between transistors E and F. However, as illustrated in layout 508, the diffusion gap can be eliminated by folding transistor F in its location of layout 506 into two folds. Thus it is shown that if folding and relative placement of transistors are taken into consideration before layout, as in the present invention, diffusion gaps can be eliminated.

FIG. 6 illustrates the effects that folding a transistor into an odd or an even number of folds has on the terminals that appear at the ends of folded transistors. Schematic 602 is a representation of a transistor including source, gate and drain nets s, g, and d respectively. Layout 604 is a representation of the transistor of schematic 602. Schematic 606 represents the transistor of schematic 602 folded into three folds. Schematic 606 represents the folded transistor as three parallel transistors all sharing a source net and a drain net. Layout 608 and 610 are alternate layouts of schematic 606. As shown, a transistor folded into an odd number of folds retains the same terminals at the two ends of the layout irrespective of its orientation (flipped or unflipped). A terminal s and a terminal d appear at ends of both unflipped layout 608 and flipped layout 610. Terminal s appears on the left in layout 608, and terminal s appears on the right in layout 610.

With an even number of folds, however, the terminals at the ends of a layout depend upon a transistor's orientation. This is illustrated in layouts 614 and 616 which are various orientations of transistor 602 as folded into two folds. Schematic 612 shows the transistor of 602 as two parallel transistors sharing a source net and a drain net. Schematic 612 can be laid out so as to include a source terminal at either end of the layout as shown in layout 614, or so as to include drain terminals at either end as shown in layout 616. Both orientations should be considered for possible abutment with other transistors. The present invention, unlike prior layout methods, considers both even and odd number of folds, where appropriate, and all orientations of transistor layouts before forming of chains or placement.

A disadvantage of prior art layout methods is that folding a transistor into an even numbers of folds always introduces a diffusion gap between chains. The present invention overcomes this disadvantage and actually exploits even number of folds to eliminate diffusion gaps as explained earlier with respect to FIG. 5. The present invention incorporates fold interlacing into an automatic process for producing layouts. Previously, fold interlacing was only performed manually, after a layout was produced. Referring to FIGS. 7*a* through 7*e*, the effects of fold interlacing on layout can be seen. FIG. 7*a* includes schematic 700 with three transistors, N1, N2, and N3 arranged in series. A, B and C are gate terminals of transistors N1, N2, and N3, respectively. Terminal X is a power terminal of the circuit of schematic 700. Terminals Y and Z are shared between N1, N2, and N3, respectively. For example, terminal Y serves as the drain terminal of N1 and the source terminal of N2. Terminal Z serves as the drain terminal of N2 and the source terminal of N3. Terminal W is the ground terminal for the circuit of schematic 700. Terminals X and W carry power and ground signals in this embodiment, but in other embodiments could carry any other signals.

FIG. 7*b* shows layout 702, one possible layout of the circuit of schematic 700 in which transistors N1, N2, and N3 are laid out consecutively as one chain. For layout 702, each transistor N1, N2, and N3 is folded into three folds.

FIG. 7*c* shows layout 704. Layout 704 is a layout of transistors N1, N2, and N3, each folded into three folds, but interlaced. Layout 704 illustrates that when transistors are folded into an odd number of folds, the nets that appear on the left and right ends of the layout are the same, in this case X and W, irrespective of interlacing. When the devices are folded into an even number of folds, however, the nets at the ends of the placement differ based on whether the devices are interlaced or not.

FIG. 7*d* illustrates layout 706, of transistors N1, N2, and N3 each folded into two folds. Without interlacing, one diffusion gap appears between transistors N1 and N2, and another diffusion gap appears between transistors N2 and N3. One of the diffusion gaps could be eliminated by flipping one of the transistors, but without fold interlacing, both diffusion gaps cannot be eliminated. Layout 708 of FIG. 7*e* shows that both of the diffusion gaps, even with an even numbers of folds, can be eliminated by fold interlacing. The present invention, unlike prior art methods, supports all possible interlacing regardless of the number of folds per transistor, while producing an optimal final placement.

Fold interlacing also provides the following layout area and performance advantages over non-interlaced placements. First, unlike non-interlaced layouts, internal nets, such as nets Y and Z in FIGS. 7*a* through 7*e* in the interlaced layout do not need to be strapped because they share diffusion. Therefore, the corresponding devices can be placed closer together. This allows denser layout and saves layout area. In addition because layouts can be denser, the diffusion area on the internal nets is reduced. This leads to better electrical (switching) properties, which equates with better circuit performance. For these reasons, fold interlacing must be considered in developing layouts for components like high performance microprocessors, where area and performance concerns are critical. In large scale production of high performance components, performing fold interlacing manually is not feasible. The present invention allows the use of fold interlacing in large scale production by incorporating it into an automatic process.

FIGS. 8*a* through 8*c* illustrate another technique used by the present invention to optimize placement for P/N pairs having transistors with unequal numbers of folds. FIG. 8*a* shows a layout 800 including a PMOS transistor 806 and an NMOS transistor 808 paired together. PMOS transistor 806 has fewer folds than does NMOS transistor 808. Layout 800 is an example of a left-justified layout. FIG. 8*b* shows layout 802 including PMOS transistor 806 and NMOS transistor 808. Layout 802 is an example of a centered layout. FIG. 8*c* shows layout 804 including transistors 806 and 808. Layout 804 is an example of a right-justified layout. Because the different layouts 800, 802 and 804 represent different orientations of nets and therefore different diffusion sharing arrangements between P/N pairs, all of the relative placements represented by layouts 800, 802 and 804 should be evaluated for diffusion sharing with other transistors or pairs. The present invention considers every orientation of pairs with unequal numbers of folds. Because every orientation of pairs with unequal numbers of folds is considered before chaining or placement, the present invention takes fullest advantage of this technique to create an optimal layout.

FIG. 9 is a flowchart illustrating steps of a method of creating a transistor cell layout according to one embodiment of the present invention. FIG. 9 will be described with reference to FIGS. 10*a*–12*b*, which illustrate details of method steps illustrated in FIG. 9. At step 902 a user enters a description of a circuit for which a layout is to be produced. A circuit description can be in the form of a schematic diagram, a net list of the circuit diagram, or a description of the circuit in a hardware description language. Typically, the circuit description exists as a file stored in the memory subsystem of a computer system implementing the present invention. The file could also be stored externally with respect to the computer system, yet accessible to the computer system. Entering the circuit description typically comprises entering a name and location of the file into the computer system using a keyboard or mouse so that the circuit description can be accessed by the present invention.

At step 904 logical clusters of transistors are identified. Logical clusters are recognized by the present invention as closely connected transistors groups. These groups typically form logic gates such as NANDS, NORS, inverters, etc.

Referring now to FIG. 10a, a schematic 1000 is shown. Schematic 1000 is an example of a circuit schematic which could be input by a user at step 902. The circuit of schematic 100 will be used as a running example of creating a transistor layout according to the embodiment of FIG. 9. Schematic 1000 represents a circuit which functions as a typical D-latch. The D-latch circuit includes a DATA input, an active low clock input CLK_BAR, a RESET input, and data outputs Q and Q_BAR. The D-latch circuit is realized by using p-type and n-type transistors. The p-type transistors include P1, P2, P3, P4, P5, P6, P7, P8 and P9. The n-type transistors include transistors N1, N2, N3, N4, N5, N6, N7, N8 and N9.

Transistors P7, P9, N9 and N7 form an example of a logical cluster. If these transistors were placed far apart from each other in a layout, long nets would be required to connect them. This would result in slower performance than if they were located closer together.

Referring again to FIG. 9, at step 906 large transistors are folded. Large transistors are defined by the user as transistors exceeding a certain height. Large transistors thus defined are folded at this stage as many times as necessary in order for individual folds to be under a maximum height specified by the user. According to this embodiment, transistors can be folded at this stage into either an even number of folds or an odd number of folds.

At step 908 P/N pairs are formed to create a set of P/N pairs. The set of P/N pairs is defined as all paired devices. At this step, unpaired devices may exist. Unpaired devices are transistors for which there are no corresponding devices. For example, a p-type transistor for which there is no n-type transistor with which to pair it is an unpaired device. In the present embodiment, the set of P/N pairs is formed using a set of prioritized criteria. The criteria may include common gate signals, least difference in the number of folds, membership in the same cluster, and common diffusion terminals. Pairing constrains the subsequent stages of the process because each pair is treated as a unit for diffusion sharing, or chain formation, which will be described below. In addition, it should be noted that if transistor folding is not considered during pairing or before pairing, pairs with large differences in the number of folds of the p and n transistors can result, producing large, unused areas on the integrated circuit.

FIG. 10b is a table showing the 9 P/N pairs of schematic 1000 that result from pairing step 908. The table of FIG. 10b lists the pairs by number from pair 1 through pair 9, as well as the particular p-type and n-type transistors in each pair. Table 10b also lists reasons for pairing particular transistors.

FIGS. 11a and 11b show the impact of transistor folding on the formation of P/N pairs. Layout 1100 of FIG. 11a is the result of a particular pairing. Layout 1100 includes two pairs where the pairs comprise P1 and N1 and P2 and N2 respectively. Layout 1102 of FIG. 11b is an example of a different pairing. Layout 1102 also includes two pairs of transistors. However, these transistor pairs include transistors P1 and N2 and P2 and N1 respectively. As can be seen, the pairing of layout 1100 wastes area equivalent to three transistors. With the pairing of layout 1102 the area of three transistors can be saved. Because the present invention considers transistor folding during pairing, unnecessarily wasteful pairings are avoided.

Referring again to FIG. 9, step 910 generates all transistor chains for the set of paired devices. Note that chains are created at this stage using only paired devices. The present invention generates transistor chains from the set of paired transistors by implicitly enumerating all such chains. Implicit enumeration refers to intelligently avoiding the enumeration of any chain which would be equivalent to another in terms of area usage and end terminal arrangement. Thus, only the chains having unique effects on area used or end terminal arrangement are enumerated, and chains that are redundant are not enumerated.

Given a set of P/N pairs, the generation of transistor chains is based on pairwise diffusion sharing in which two pairs can be abutted together only if the p-type and n-type transistors of the pairs can share their diffusions. For this embodiment of the present invention, pairwise abutment is modeled as an adjacency list which is used to efficiently generate the set of all transistor chains implicitly as described above. FIG. 12a shows list 1202 of all P/N pairs and the list of pairs that can share diffusion with each pair. According to 910, for each pair in list 1202, an adjacency list stores the information of list 1202, as well as terminals which occur at the ends of possible abutments and the orientations of the transistors for the possible abutments. Thus pair P6, for example, can possibly be abutted with P4 in multiple configurations. P6 will occur as many times in the adjacency list of P4 as there are configurations.

During chain generation step 910, all transistor folds and orientations are taken into account. If a transistor has an even number of folds, both flipped and unflipped orientations are considered. If p-type and n-type transistors have unequal number of folds, all three relative placements are considered. In addition, interlacing of transistor folds for both even and odd numbers of folds is considered at this step. The implicit set of all possible transistor chains is generated in a bottom-up manner. That is, a transistor chain of one transistor is formed first, and then transistor chains of increasingly large numbers of transistors are formed.

Table 1204 of FIG. 12a shows the list of chains resulting from step 910 classified by length. In table 1204 chains of lengths one transistor through seven transistors are listed along with the number of chains for each particular length. For example, there are nine chains of one transistor in length, nineteen chains of two transistors in length, and so on. The total number of chains implicitly generated for the circuit of schematic 1000 is 72 chains.

As stated, chains which may be different in one characteristic, for example an order of pairs, may be exactly the same in terms of resulting area usage and circuit performance. The present invention generates chains in an intelligent manner such that two non-identical chains that yield the same area usage and performance are not both retained. The present invention also takes routing costs into consideration during chain formation. For example, two chains that contain the same pairs but in different orders or orientation must be retained because they may have different routing costs.

Referring again to FIG. 9, step 912 of generating chain covers follows step 910 of generating transistor chains. A chain cover is a subset of chains that satisfies the following conditions: (1) it contains each P/N pair exactly once; (2) it has less chains, and therefore less diffusion gaps, than other subsets of chains satisfying condition (1); and (3) it requires less horizontal tracks for routing than other subsets of chains satisfying condition (1).

This embodiment of the present invention generates a set of chain covers by using well known graph theory techniques. An undirected graph is constructed to model pairwise disjointness of chains. Finding all chain covers of the given circuit translates into finding a set of cliques in the undirected graph. A clique in an undirected graph is a maximal complete sub-graph not contained in any other complete sub-graph. For purposes of this embodiment, each clique is a chain cover as defined above. A number of algorithms can be used to find the set of cliques in an undirected graph. Such algorithms and their development are well known in the art and will not be described further.

A clique graph for the D-latch network of schematic 1000 contains six cliques of two chains each which are shown in the table of FIG. 12b, with each chain represented as an ordered list of P/N pairs. The clique graph also states an interconnect cost associated with each clique. For example, clique 1 includes transistor chains 1 and 2, where transistor chain 1 includes P/N pairs 8, 6 and 4, and transistor chain 2 includes P/N pairs 2, 7, 9, 1, 5, and 3. The interconnect cost for clique 1 is 40.

Referring again to FIG. 9, after the set of chain covers, or cliques, has been generated, a best cover, designated "C", is selected in step 914. To select a best cover C according to step 914, a particular clique is chosen by: (1) reducing cell layout height by finding a linear ordering of chains and their individual orientations that reduces the number of routing tracks; and (2) reducing other performance-related criteria such as diffusion area and critical net length.

A recursive branch and bound technique with efficient pruning heuristics is used to determine a relative chain order with the less total wire length than other relative chain orders. An edge-weighted connectivity graph is constructed with a node for each chain and an edge between every pair of chains. Each edge has a cost equal to the number of common nets between the chains. A recursive depth first traversal is then performed on the connectivity graph. Before a node is extended at any stage in the graph traversal, the partial cost of adding the node to the partial linear arrangement generated so far (a lower bound on the cost) is compared with the present value of the best cost, if any. Thus, the determination of the best linear arrangement proceeds in a bottom-up manner by incrementally adding nodes to existing partial arrangements.

After the determination of the best linear arrangement for a given chain cover, the final objective is to find orientations of each chain that further reduce the total interconnect length. Here, since the position of each transistor is known, actual wire lengths are computed based on a linear distance between the physically nearest transistor terminals on a common net. As illustrated in FIG. 12b, the total interconnect length for a linear placement of the sixth chain cover of the D-latch is about one third that of the first. Thus, the routing complexity and cell area can be greatly reduced by selecting a minimum-sized chain cover which also reduces the total wire length.

In summary, at this stage in the process, chain covers, or cliques have been found which include the fewest possible diffusion gaps. From this group of chain covers, a best cover C is chosen, where C is a layout that reduces height and total interconnect length.

Referring to FIG. 9 at step 916 it is next determined whether any unpaired transistor devices exist. If no unpaired transistor devices exist, the layout obtained from step 914 is mapped to a particular integrated circuit technology at step 920. Then a cell layout in typical graphical format is produced in step 922. If unpaired transistor devices exist at step 916, the set of P/N pairs is redefined at step 918 to include only the chains in C and the unpaired devices. Then step 910 of generating all transistor chains from the set of P/N pairs is repeated. At step 910, the unpaired devices are chained with the chains in C to implicitly generate all possible chains. Next, steps 912, 914, and 916 are repeated.

It is possible in other embodiments to include unpaired devices in chain formation at step 908. It has been empirically determined, however, that leaving unpaired devices out of initial chain formation yields superior results in terms of generating a desirable layout.

FIG. 13 is a simplified block diagram of a computer system 1300 configured to implement an embodiment of the present invention. Different components of computer system 1300 communicate over bus 1301. Computer system 1300 can communicate with other computer systems (not shown) that are connected to bus 1301.

Processor 1302 performs operations on data. For example, processor 1302 includes arithmetic and logic unit (ALU) 1304, which performs arithmetic functions and, typically, Boolean logic functions on data and produces results. Users of computer system 1300 input data through input device 1311, which can be, for example, a mouse device or a keyboard. Display device 1310 displays input and output on a screen. Memory subsystem 1308 includes random access memory, read only memory and cache memory. Processor 1302 configures and uses the various types of memory in an attempt to operate efficiently and quickly. Several well known memory management techniques may be used to manage memory subsystem 1308.

Application program 1306 is an embodiment of the present invention as a software program. In other embodiments, the present invention could be realized in hardware. As application program 1306, this embodiment of the present invention is grouped into functional modules, including "Fold", "Form P/N Pairs", and so on, as shown. Memory area 1312 is an area of memory separate from the area storing application program 1306. Memory area 1312 stores other information, for example, data for the use of application program 1306, including the circuit description entered by the user. A user invoking application 1306, would, for example, enter the circuit design for which a layout is desired by inputting the name and memory location of the circuit description. In other embodiments, the circuit description could be stored on and accessed from a memory subsystem of another computer system (not shown) on bus 1301.

What is claimed is:

1. A computer implemented method for generating a layout for a set of transistors on a semiconductor chip, comprising:

identifying logical clusters of transistors among the set of transistors;

folding transistors of the set of transistors whose sizes exceed a predetermined maximum size;

creating a set of P/N pairs from the set of transistors, each P/N pair comprising a p-type metal oxide semiconductor (PMOS) transistor and an n-type MOS (NMOS) transistor; and generating a set of substantially all possible transistor chains using the set of P/N pairs, each transistor chain comprising at least one P/N pair, wherein at least identifying and folding occur before placement of the set of transistors.

2. The method of claim 1, further comprising implicitly generating a set of every possible transistor chain using the set of P/N pairs, each transistor chain comprising at least one P/N pair, P/N pairs of each chain sharing diffusion areas with adjacent P/N pairs.

3. The method of claim 2, further comprising:
generating a set of chain covers from the set of every possible transistor chain, each chain cover comprising one occurrence of each transistor of the set of transistors and arranged as a set of transistor chains of a smallest possible width; and
selecting a best chain cover of the set of chain covers having a least cell height, a least diffusion area and a least net length.

4. The method of claim 3, further comprising:
determining if there are any unpaired transistors;
if there are unpaired transistors, implicitly generating a set of every possible transistor chain using transistor chains of the best chain cover and the unpaired transistors; and
repeating generating a set of chains covers and selecting a best chain cover.

5. The method of claim 2, further comprising:
after folding, for each P/N pair, creating a list of pairs that can share diffusion with the pair including respective orientations of pairs of the list, and a list of terminals occurring at ends of pairs of the list;
generating transistor chains that are unique with respect to transistor folds; and
generating transistor chains that are unique with respect to transistor orientations.

6. The method of claim 2, further comprising:
for each P/N pair having PMOS and NMOS transistors with an unequal number of folds, generating unique transistor chains for each possible relative placement of the PMOS and NMOS transistors; and
generating transistor chains that are unique with respect to transistor fold interlacing arrangements.

7. The method of claim 1, further comprising generating the set of every possible transistor chain by generating a chain of one P/N pair and then generating chains of progressively greater numbers of P/N pairs.

8. The method of claim 1, wherein at least creating a set of P/N pairs includes keeping transistors of a same logical cluster in proximity to each other.

9. Optimizing a set of transistors to an integrated circuit (IC) comprising:
folding transistors of the set of transistors whose size exceeds a predetermined maximum size;
before placement of the transistors, generating an exhaustive list of transistor arrangements that satisfy design rules and choosing an arrangement from the list that uses a minimal area; and
before placement of the transistors, generating a placement of the set of transistors on the IC according to the chosen arrangement.

10. The IC of claim 9, further produced by:
forming P/N pairs using the set of transistors, wherein a P/N pair comprises a p-type metal oxide semiconductor (PMOS) transistor and an n-type MOS (NMOS) transistor;
generating a set of every possible transistor chain using the P/N pairs, a chain comprising at least one transistor pair, multiple transistor pairs sharing adjacent diffusion areas;
generating a set of chain covers from the set of every possible transistor chain, each chain cover comprising one occurrence of each transistor of the set; and
selecting a best chain cover having a least cell height, a least diffusion area, and a least net length.

11. The IC of claim 10, further produced by:
determining if there are any unpaired transistors;
if there are unpaired transistors, implicitly generating a set of every possible transistor chain using transistor chains of the best chain cover and the unpaired transistors;
repeating generating a set of chains covers and selecting a best chain cover;
generating transistor chains that are unique with respect to transistor folds; and
generating transistor chains that are unique with respect to transistor orientations.

12. The IC of claim 10, further produced by:
for each P/N pair having PMOS and NMOS transistors with an unequal number of folds, generating unique transistor chains for each possible relative placement of the PMOS and NMOS transistors; and
generating transistor chains that are unique with respect to transistor fold interlacing arrangements.

13. The IC of claim 12, further produced by identifying and maintaining logical clusters of the set of transistors, the logical clusters comprising transistors realizing common logic functions.

14. A computer readable medium storing a sequence of instructions comprising:
identifying, among a set of transistors to be placed on an integrated circuit (IC), logical clusters of transistors, wherein a logical cluster performs a logic function;
before placement of the transistors on the IC, folding transistors of the set of transistors whose size exceeds a predetermined maximum size;
before placement of the transistors on the IC, generating an exhaustive list of transistor arrangements from the set of transistors, wherein each arrangement of the list satisfies design rules;
choosing an arrangement from the list that uses a least IC area; and
generating a placement of the set of transistors on the IC.

15. The medium of claim 14, wherein the instructions further cause the processor to perform:
forming P/N pairs using the set of transistors, wherein a P/N pair comprises a p-type metal oxide semiconductor (PMOS) transistor and an n-type MOS (NMOS) transistor;
implicitly generating a set of every possible transistor chain using the P/N pairs, each transistor chain comprising at least one P/N pair, P/N pairs of each chain sharing diffusion areas with adjacent P/N pairs;
generating a set of chains covers from the set of every possible transistor chain, each chain cover comprising one occurrence of each P/N pair arranged as a set of transistor chains of minimal cell width that can be validly laid out on the IC; and
selecting a best chain cover having minimum cell height, minimum diffusion area and minimum net length.

16. The medium of claim 15, wherein the instructions further cause the processor to perform:
determining if there are any unpaired transistors;
if there are unpaired transistors, implicitly generating a set of every possible transistor chain using transistor chains of the best chain cover and the unpaired transistors;

repeating generating a set of chains covers and selecting a best chain cover;

generating transistor chains that are unique with respect to transistor folds; and generating transistor chains that are unique with respect to transistor orientations.

17. The medium of claim 16, wherein the instructions further cause the processor to perform:

for each P/N pair having PMOS and NMOS transistors with an unequal number of folds, generating unique transistor chains for each possible relative placement of the PMOS and NMOS transistors;

generating transistor chains that are unique with respect to transistor fold interlacing arrangements; and implicitly generating a set of every possible transistor chain by generating a chain of one P/N pair and then generating chains of progressively greater numbers of P/N pairs.

18. A computer readable medium storing instructions comprising:

before placement of the transistors on the IC, defining logical clusters among the set of transistors, wherein logical clusters perform logic operations;

before placement of the transistors on the IC, folding transistors of the set of transistors whose sizes exceed a predetermined size; and enumerating diffusion sharing arrangements of transistors of the set of transistors, taking logical clusters into consideration.

19. The medium of claim 18, wherein exhaustively enumerating diffusion sharing arrangements includes:

pairing p-type metal oxide semiconductor (PMOS) transistors with n-type MOS (NMOS) transistors to form P/N pairs;

placing transistors of P/N pairs with unequal numbers of PMOS folds and NMOS folds in every possible position with respect to each other and generating sets of diffusion sharing arrangements for each position; and placing transistors folded into an even number of folds in flipped and unflipped positions and generating sets of diffusion sharing arrangements for each position.

20. A computer implemented method for generating a layout for a set of transistors on a semiconductor chip, comprising:

before placement of the transistors, identifying logical clusters of transistors among the set of transistors;

before placement of the transistors, folding transistors of the set whose sizes exceed a predetermined maximum size;

creating a set of P/N pairs from the set of transistors, each P/N pair comprising a p-type metal oxide semiconductor (PMOS) transistor and an n-type MOS (NMOS) transistor; and generating a set of substantially all possible transistor chains using the set of P/N pairs, each transistor chain comprising at least one P/N pair, P/N pairs of each chain sharing diffusion areas with adjacent P/N pairs, generating a set of chain covers from the set of every possible transistor chain, each chain cover comprising one occurrence of each transistor of the set of transistors and arranged as a set of transistor chains of a smallest possible width; and selecting a best chain cover of the set of chain covers having a least cell height, a least diffusion area and a least net length, generating a placement of the set of transistors on the IC after said transistors are folded and said list generated.

21. A computer readable medium storing instructions comprising:

defining logical clusters among the set of transistors, wherein logical clusters perform logic operations;

before placement of the transistors on the IC, folding transistors of the set of transistors whose sizes exceed a predetermined size; and before placement of the transistors on the IC, enumerating diffusion sharing arrangements of transistors of the set of transistors, taking logical clusters into consideration, P/N pairs of each chain sharing diffusion areas with adjacent P/N pairs, generating a set of chain covers from the set of every possible transistor chain, each chain cover comprising one occurrence of each transistor of the set of transistors and arranged as a set of transistor chains of a smallest possible width; and selecting a best chain cover of the set of chain covers having a least cell height, a least diffusion area and a least net length.

22. Optimizing a set of transistors to an integrated circuit (IC) comprising:

before placement of the transistors on the IC, folding transistors of the set of transistors whose size exceeds a predetermined maximum size;

before placement of the transistors on the IC, generating an exhaustive list of transistor arrangements that satisfy design rules and choosing an arrangement from the list that uses a minimal area;

generating a placement of the set of transistors on the IC according to the chosen arrangement, wherein generating a placement of the set of transistors on the IC occurs after folding transistors and generating a list of transistor arrangements;

forming P/N pairs using the set of transistors, wherein a P/N pair comprises a p-type metal oxide semiconductor (PMOS) transistor and an n-type MOS (NMOS) transistor;

generating a set of every possible transistor chain using the P/N pairs, a chain comprising at least one transistor pair, multiple transistor pairs sharing adjacent diffusion areas;

generating a set of chain covers from the set of every possible transistor chain, each chain cover comprising one occurrence of each transistor of the set; and selecting a best chain cover having a least cell height, a least diffusion area, and a least net length.

23. A computer readable medium storing a sequence of instructions comprising:

before placement of the transistors on the IC, identifying, among a set of transistors to be placed on an IC, logical clusters of transistors, wherein a logical cluster performs a logic function;

before placement of the transistors on the IC, folding transistors of the set of transistors whose size exceeds a predetermined maximum size;

generating an exhaustive list of transistor arrangements from the set of transistors, wherein each arrangement of the list satisfies design rules;

choosing an arrangement from the list that uses a least IC area;

generating a placement of the set of transistors on the IC;

forming P/N pairs using the set of transistors, wherein a P/N pair comprises a p-type metal oxide semiconductor (PMOS) transistor and an n-type MOS (NMOS) transistor;

implicitly generating a set of every possible transistor chain using the P/N pairs, each transistor chain comprising at least one P/N pair, P/N pairs of each chain sharing diffusion areas with adjacent P/N pairs;

generating a set of chains covers from the set of every possible transistor chain, each chain cover comprising one occurrence of each P/N pair arranged as a set of transistor chains of minimal cell width that can be validly laid out on the IC; and selecting a best chain cover having a minimum cell height, minimum diffusion area and minimum net length, wherein generating a placement of the set of transistors on the IC occurs after folding transistors and generating a list of transistor arrangements.

24. A computer implemented method for generating a layout for a set of transistors on a semiconductor chip, comprising:

identifying logical clusters of transistors among the set of transistors;

folding transistors of the set whose sizes exceed a predetermined maximum size;

creating a set of P/N pairs from the set of transistors, each P/N pair comprising a p-type metal oxide semiconductor (PMOS) transistor and an n-type MOS (NMOS) transistor; and generating a set of substantially all possible transistor chains using the set of P/N pairs, each transistor chain comprising at least one P/N pair, wherein at least identifying and folding occur before placement of the set of transistors;

implicitly generating a set of every possible transistor chain using the set of P/N pairs, each transistor chain comprising at least one P/N pair, P/N pairs of each chain sharing diffusion areas with adjacent P/N pairs; and generating a set of chain covers from the set of every possible transistor chain, each chain cover comprising one occurrence of each transistor of the set of transistors and arranged as a set of transistor chains of a smallest possible width.

25. A computer implemented method for generating a layout for a set of transistors on a semiconductor chip, comprising:

identifying logical clusters of transistors among the set of transistors;

folding transistors of the set of transistors whose sizes exceed a predetermined maximum size;

creating a set of P/N pairs from the set of transistors, each P/N pair comprising a p-type metal oxide semiconductor (PMOS) transistor and an n-type MOS (NMOS) transistor;

generating a set of substantially all possible transistor chains using the set of P/N pairs, each transistor chain comprising at least one P/N pair, wherein at least identifying and folding occur before placement of the set of transistors;

implicitly generating a set of every possible transistor chain using the set of P/N pairs, each transistor chain comprising at least one P/N pair, P/N pairs of each chain sharing diffusion areas with adjacent P/N pairs; and generating a set of chain covers from the set of every possible transistor chain, each chain cover comprising one occurrence of each transistor of the set of transistors and arranged as a set of transistor chains of a smallest possible width.

26. Optimizing a set of transistors to an integrated circuit (IC) comprising:

before placement of transistors, folding transistors of the set of transistors whose size exceeds a predetermined maximum size;

before placement of the transistors, generating an exhaustive list of transistor arrangements that satisfy design rules and choosing an arrangement from the list that uses a minimal area;

before placement of the transistors, generating a placement of the set of transistors on the IC according to the chosen arrangement;

implicitly generating a set of every possible transistor chain using the set of P/N pairs, each transistor chain comprising at least one P/N pair, P/N pairs of each chain sharing diffusion areas with adjacent P/N pairs; and generating a set of chain covers from the set of every possible transistor chain, each chain cover comprising one occurrence of each transistor of the set of transistors and arranged as a set of transistor chains of a smallest possible width.

27. A computer readable medium storing a sequence of instructions comprising:

identifying, among a set of transistors to be placed on an integrated circuit (IC), logical clusters of transistors, wherein a logical cluster performs a logic function;

before placement of the transistors on the IC, folding transistors of the set of transistors whose size exceeds a predetermined maximum size;

before placement of the transistors on the IC, generating an exhaustive list of transistor arrangements from the set of transistors, wherein each arrangement of the list satisfies design rules;

choosing an arrangement from the list that uses a least IC area;

generating a placement of the set of transistors on the IC;

implicitly generating a set of every possible transistor chain using the set of P/N pairs, each transistor chain comprising at least one P/N pair, P/N pairs of each chain sharing diffusion areas with adjacent P/N pairs; and generating a set of chain covers from the set of every possible transistor chain, each chain cover comprising one occurrence of each transistor of the set of transistors and arranged as a set of transistor chains of a smallest possible width.

28. A computer readable medium storing instructions comprising:

before placement of the transistors on the IC, defining logical clusters among the set of transistors, wherein logical clusters perform logic operations;

before placement of the transistors on the IC, folding transistors of the set of transistors whose sizes exceed a predetermined size;

enumerating diffusion sharing arrangements of transistors of the set of transistors, taking logical clusters into consideration;

implicitly generating a set of every possible transistor chain using the set of P/N pairs, each transistor chain comprising at least one P/N pair, P/N pairs of each chain sharing diffusion areas with adjacent P/N pairs; and generating a set of chain covers from the set of every possible transistor chain, each chain cover comprising one occurrence of each transistor of the set of transistors and arranged as a set of transistor chains of a smallest possible width.

29. A computer readable medium storing a sequence of instructions comprising:

before placement of the transistors on the IC, identifying, among a set of transistors to be placed on an IC, logical clusters of transistors, wherein a logical cluster performs a logic function;

before placement of the transistors on the IC, folding transistors of the set of transistors whose size exceeds a predetermined maximum size;

generating an exhaustive list of transistor arrangements from the set of transistors, wherein each arrangement of the list satisfies design rules;

choosing an arrangement from the list that uses a least IC area;

generating a placement of the set of transistors on the IC;

forming P/N pairs using the set of transistors, wherein a P/N pair comprises a p-type metal oxide semiconductor (PMOS) transistor and an n-type MOS (NMOS) transistor;

implicitly generating a set of every possible transistor chain using the P/N pairs, each transistor chain comprising at least one P/N pair, P/N pairs of each chain sharing diffusion areas with adjacent P/N pairs;

generating a set of chains covers from the set of every possible transistor chain, each chain cover comprising one occurrence of each P/N pair arranged as a set of transistor chains of minimal cell width that can be validly laid out on the IC;

selecting a best chain cover having a minimum cell height, minimum diffusion area and minimum net length, wherein generating a placement of the set of transistors on the IC occurs after folding transistors and generating a list of transistor arrangements;

implicitly generating a set of every possible transistor chain using the set of P/N pairs, each transistor chain comprising at least one P/N pair, P/N pairs of each chain sharing diffusion areas with adjacent P/N pairs; and generating a set of chain covers from the set of every possible transistor chain, each chain cover comprising one occurrence of each transistor of the set of transistors and arranged as a set of transistor chains of a smallest possible width.

* * * * *